United States Patent [19]

Glomb et al.

[11] Patent Number: 4,659,165
[45] Date of Patent: Apr. 21, 1987

[54] CENTERING STRIP FOR PLUGGING TO A BACKPLANE PRINTED CIRCUIT BOARD

[75] Inventors: Kurt Glomb, Germering; Heinz Niggl, Holzkirchen; Leo Pelzl; Karl Zell, both of Niederpoecking, all of Fed. Rep. of Germany

[73] Assignee: Siemens Aktiengesellschaft, Berlin and Munich, Fed. Rep. of Germany

[21] Appl. No.: 783,111

[22] Filed: Oct. 2, 1985

[30] Foreign Application Priority Data

Nov. 12, 1984 [DE] Fed. Rep. of Germany ....... 3441301

[51] Int. Cl.[4] .............................................. H01R 9/09
[52] U.S. Cl. ................................. 339/176 M; 29/764
[58] Field of Search ............ 339/17 R, 17 L, 17 LM, 339/17 C, 91 R, 125 R, 126 R, 126 RS, 128, 196 M, 176 M; 29/762, 764, 278

[56] References Cited

U.S. PATENT DOCUMENTS

| | | | |
|---|---|---|---|
| 3,588,983 | 6/1971 | Hoy | 29/764 |
| 3,594,696 | 7/1971 | Witek, Jr. | 339/91 R |
| 4,068,374 | 1/1978 | Coller | 29/764 |
| 4,173,387 | 11/1979 | Zell | 339/196 M |
| 4,447,102 | 5/1984 | Kourimsky et al. | 339/91 R |

Primary Examiner—Neil Abrams

[57] ABSTRACT

The invention relates to a centering strip for plugging onto a backplane printed circuit board provided with contact blades, whereby the centering strip serving for the acceptance of spring clips has a rectangular housing open at one side. For easy pulling of centering strips plugged to a backplane printed circuit board directly next to one another, cutouts into which parts of a pulling tool can engage proceeding from the inside are provided in the side walls of two of the centering strips.

8 Claims, 1 Drawing Figure

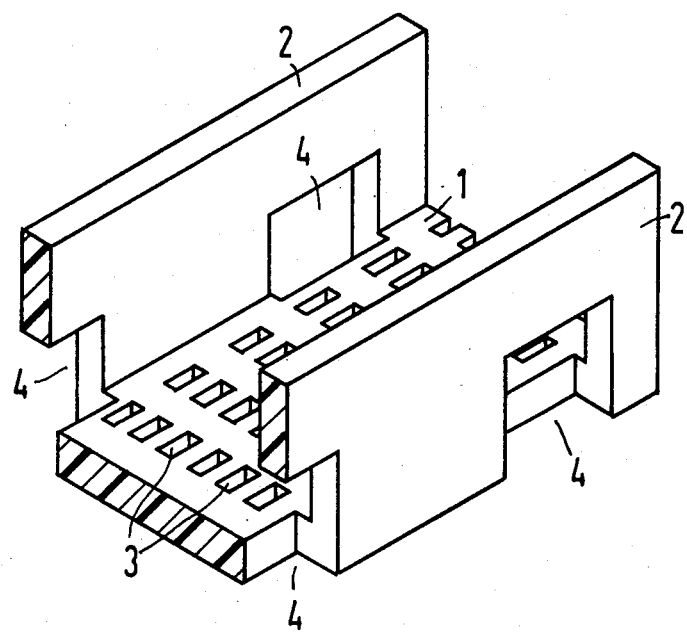

CENTERING STRIP FOR PLUGGING TO A BACKPLANE PRINTED CIRCUIT BOARD

BACKGROUND OF THE INVENTION

1. Field of the Invention

The invention relates to a centering strip for plugging to a backplane printed circuit board provided with contact knives, wherein the centering strip serving the acceptance of spring clips is constructed as a rectangular housing open at one side.

2. Description of the Prior Art

Such known centering strips are simultaneously plugged onto a plurality of rows of contact knives of the backplane printed circuit board. When the rows of contact knives on the backplane printed circuit board are distributed such that free spaces arise between the centering strips, then the plugging and the pulling of the individual centering strips does not present any problems. When the distribution of the contact knives on the backplane printed circuit board is such that the centering strips can be plugged next to one another without any intervening space, then the plugging of the centering strips does not present any problems. Problems do arise, however, in this case with respect to the pulling of the centering strips from the contact knives as needed, for example for repair purposes.

SUMMARY OF THE INVENTION

An object of the present invention is to provide a centering strip of the type described above which can also be easily pulled when a plurality of centering strips are pluggable to a backplane printed circuit board next to one another without intervening space.

For a centering strip of the type described, this object is achieved in accord with the invention in that cutouts lying opposite one another are provided at prescribed intervals in the side walls.

It is possible in this fashion to hook hooks of an arbitrarily designed pulling tool into the side walls of the blade connector, whereby the hooks engage from the inside into the cutouts of the side walls. It is thus possible to pull individual centering strips of a plurality of centering strips plugged onto a backplane printed circuit board directly next to one another without great outlay as needed.

A development of the centering strip of the invention is characterized in that the cutouts are provided in the lower half of the side walls. The force required in pulling is thereby distributed to larger areas of the side walls.

BRIEF DESCRIPTION OF THE DRAWINGS

The invention shall be explained in greater detail below with reference to an exemplary embodiment shown in the drawing.

The drawing shows a perspective view of a part of a centering strip constructed in accord with the invention.

DESCRIPTION OF THE PREFERRED EMBODIMENTS

A partially illustrated centering strip 5 is plugged onto a backplane printed circuit board equipped with inserted contact blades and serves for the acceptance of spring clips which are rigidly connected to electrical assemblies. When plugging the centering strips onto a backplane printed circuit board equipped with contact blades, the contact blades pass through passages 3 in a floor 1 of the centering strip. The illustrated centering strip is laterally bounded by the side walls 2. These side walls 2 include cutouts 4 at prescribed intervals, such that a respective cutout 4 of one side wall lies opposite a cutout 4 of the other side wall 2.

These cutouts 4 serve the purpose of enabling the emplacement of a pulling tool in case the individual centering strips are plugged directly next to one another on a backplane printed circuit board. Parts of a pulling tool can thereby engage from the inside of the centering strip into the cutouts 4, whereby an easy pulling of the centering strips is enabled. The illustration of a pulling tool has been omitted in this context since the design thereof can be arbitrary and is not essential to the invention.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim as our invention:

1. In a centering strip for plugging onto contact blades of a backplane printed circuit board, whereby said centering strip serving for the acceptance of spring clips is fashioned as a rectangular housing with at least two opposed upstanding sidewalls open at a top side, the improvement comprising cutouts lying opposite one another are provided in the sidewalls at predetermined intervals, the cutouts sized to receive hooks of a pulling tool from within the housing; whereby centering strips may be plugged onto circuit boards directly next to one another and selectively removed from the contact blades by a pulling tool engaging said cutouts.

2. A centering strip according to claim 1, wherein said cutouts are provided in the lower half of said side walls.

3. A centering strip for plugging onto contact blades of a printed circuit board comprising:
   a rectangular hollow housing having at least two, opposed upstanding sidewalls, a floor with openings therein for receiving the contact blades and an open top;
   said two opposed sidewalls having openings therethrough at predetermined spacings which are accessible through said open top by a pulling tool after said centering strip has been plugged onto the printed circuit board;
   whereby centering strips may be plugged onto circuit boards directly next to one another and selectively removed from the contact blades by a pulling tool engaging said openings.

4. A centering strip according to claim 3, wherein said openings are spaced along said opposing walls to provide pairs of opposed openings.

5. A centering strip according to claim 4, wherein said openings are provided only in the lower half of said side walls.

6. A centering strip for plugging onto contact blades of a printed circuit board comprising:
   a rectangular hollow housing with an interior accessible through at least one open side, and means engagable by a pulling tool from the inside of said centering strip to permit exertion of a pulling force in the removal of said strip from the printed circuit board; whereby centering strips may be plugged onto circuit boards directly next to one another and selectively removed from the contact blades by a pulling tool engaging said means.

7. A centering strip according to claim 6, wherein said centering strip has upstanding sidewalls and said engagable means are provided on said sidewalls.

8. A centering strip according to claim 7, wherein said engagable means comprise opposed openings formed in the bottom half of said side walls.

* * * * *